United States Patent
Ehnholm et al.

[11] Patent Number: 6,104,192
[45] Date of Patent: Aug. 15, 2000

[54] MAGNETIC RESONANCE IMAGING SYSTEM WITH FLOATING POLE PIECES

[75] Inventors: Gösta Jakob Ehnholm, Helsinki; Ilmari Kinanen, Espoo; Robert G. Gylling, Helsinki, all of Finland; Ian R. Young, West Overton Nr. Marlborough, United Kingdom; Gordon D. DeMeester, Wickliffe, Ohio

[73] Assignee: Picker Nordstar Corporation, Helsinki, Finland

[21] Appl. No.: 09/304,741

[22] Filed: May 4, 1999

Related U.S. Application Data

[63] Continuation of application No. 08/972,192, Nov. 18, 1997.
[51] Int. Cl.⁷ .................................................... G01V 3/00
[52] U.S. Cl. ............................................ 324/319; 324/320
[58] Field of Search ................................. 324/318, 319, 324/320, 322, 300, 307, 309; 335/216, 296, 297, 298; 600/410, 421, 422

[56] References Cited

U.S. PATENT DOCUMENTS

| | | | |
|---|---|---|---|
| 4,766,378 | 8/1988 | Danby et al. | 324/307 |
| 5,250,901 | 10/1993 | Kaufman et al. | 324/318 |
| 5,519,372 | 5/1996 | Palkovich et al. | 324/318 |
| 5,735,278 | 4/1998 | Hoult et al. | 324/318 |

*Primary Examiner*—Louis Arana
*Attorney, Agent, or Firm*—Fay, Sharpe, Fagan, Minnich & McKee, LLP

[57] ABSTRACT

A magnetic resonance imaging suite is sheathed with plates (32, 34, 36) of iron or other ferrous material. The plates define projections (42, 44, 54, 54', 68) in alignment with each other on opposite ceiling and floor or wall surfaces. A pair of magnetic pole pieces (10, 10'; 50, 50'; 60, 60') are surrounded by superconducting electromagnetic coils (12, 12'; 52, 52'; 62, 62'). The pole pieces are positioned between the ferrous plates in axial alignment. When current flows through the electromagnetic coils, magnetic flux flows between the pole pieces. The ferrous wall sheathing or other ferrous constructions define a flux return path. The pole pieces are magnetically attracted toward each other and are each magnetically mirrored in and attracted toward the adjacent ferrous flux return path. The pole pieces are positioned relative to each other and the ferrous flux return path such that the attraction between the pole pieces is balanced by the attraction between each pole piece and its magnetically mirrored image in the adjacent ferrous material of the flux return path. Optionally, the magnets are selectively extinguished and one or both pole pieces are moved for better access to the patient.

21 Claims, 4 Drawing Sheets

MAGNETIC RESONANCE IMAGING SYSTEM WITH FLOATING POLE PIECES

This is a continuation application of pending prior application U.S. Ser. No. 08/972,192, filed on Nov. 18, 1997.

BACKGROUND OF THE INVENTION

The present invention relates to the magnet arts. It finds particular application in conjunction with magnetic resonance imaging and will be described with particular reference thereto. It is to be appreciated, however, that the invention will also find application in conjunction with spectroscopy, magnetic therapy, and the like.

Many magnetic resonance imaging systems have a patient receiving bore surrounded by a series of annular magnet windings. In an annular bore system, access to the patient is limited. Moreover, such systems are claustrophobic to some patients.

To obtain more openness, magnetic resonance imaging systems have been created in which one annular magnet is disposed above a patient gap and another annular magnet is positioned below the patient gap. The patient is horizontally received between the magnets. Typically, ferrous pole pieces are connected with the magnets to improve the linearity and strength of the vertical field. Commonly, the pole pieces are connected with a C-shaped iron yoke which defines a flux return path between the two annular driver coils situated on either side of the patient gap. In order to accommodate the relatively high magnetic fluxes flowing through the C-arm without saturating, the C-arm has a substantial cross-section. The C-shaped iron yoke also supports the magnets and the pole pieces. The C-shaped iron yoke has sufficient strength to resist the 50–100 tons of attractive force between the pole pieces.

For a 0.5 T magnet with a 65 cm gap, a C-arm with adequate strength and magnetic flux capability weights about 40 tons. Such an arm is too heavy for normal transportation in one piece. It is also not practical to assemble, shim, and test such magnets at the customer site.

To accommodate these concerns, magnets have been constructed with two or even four symmetric, iron flux return paths. However, the multiple return paths provide multiple interferences with access to the patient. Further, the magnets are attracted to any nearby iron, creating lateral forces on the magnets, distortions in the magnetic field, inductive heating, and the like. Moreover, such stresses create the risk of quenching the superconducting magnet.

When the magnet is constructed without a ferrous return path, high fringe fields are generated. The fringe fields can be minimized by minimizing the patient gap, i.e., at the expense of patient access and utility. Moreover, the high attractive forces between the pole pieces still require substantial structural elements to keep the pole pieces apart.

The present invention contemplates a new and improved magnetic resonance system which overcomes the above-referenced problems and others.

SUMMARY OF THE INVENTION

In accordance with one aspect of the present invention, a magnetic resonance suite is provided. A ferrous layer extends along a ceiling of the suite and another ferrous layer extends along a floor region of the suite. Ferrous sections extend along a wall region between the floor and ceiling ferrous layers. First and second electrical coils for generating a magnetic flux through a patient receiving region defined therebetween are disposed in the suite surrounded by the floor region, the ceiling, and the wall region in such a manner that the floor and ceiling ferrous layers and the wall ferrous sections define a flux return path between the coils.

In accordance with another aspect of the present invention, a magnetic resonance system includes first and second magnetizing coils disposed in a shielded room. The coils are aligned with each other and displaced to define a patient receiving gap. The first and second coils are magnetically attracted to each other. A first ferrous layer is disposed along a ceiling of the shielded room and a second ferrous layer is disposed along a floor of the shielded room. The first coil is disposed adjacent and displaced from the first ferrous layer such that the first coil is magnetically attracted toward the first ferrous layer. The second coil is disposed adjacent and displaced from the second ferrous layer such that the second coil is magnetically attracted toward the second ferrous layer. The displacements of the first and second coils between each other and between the first and second layers is such that the magnetic attraction between the first and second coils is counterbalanced by the magnetic attraction between the first coil and the first ferrous layer and the magnetic attraction between the second coil and the second ferrous layer.

In accordance with another aspect of the present invention, a magnet system is provided. A first ferrous layer extends along a ceiling of a room and a second ferrous layer extends along a floor of the room. Ferrous sections extend between the first and second ferrous layers to define a magnetic flux path between the first and second ferrous layers. An upper pole piece is disposed adjacent and displaced from the first ferrous layer and a lower pole piece is disposed adjacent the second ferrous layer. The upper and lower pole pieces are displaced from each other to define a subject receiving gap therebetween. A magnet assembly induces a magnetic flux through a magnetic flux loop extending between the pole pieces through the subject receiving gap, between the upper pole piece and the first ferrous layer, through the upper ferrous layer, the ferrous sections, and the second ferrous layer, and between the second ferrous layer and the lower pole piece. The magnetic flux causes magnetic attraction between the upper and lower pole pieces, between the upper pole piece and the first ferrous layer, and between the lower pole piece and the second ferrous layer. The pole pieces are displaced from each other and from the first and second ferrous layers such that the magnetic attraction forces between the pole pieces is counterbalanced by the magnetic attraction forces between the pole pieces and the first and second layers.

In accordance with another aspect of the present invention, a magnetic resonance method is provided. Surfaces of a radio frequency shielded room are lined with ferrous sheathing. A pair of pole pieces are disposed with associated electromagnets in the shielded room. The pole pieces are displaced from each other to define a patient receiving gap.

One advantage of the present invention is that the magnetic forces on coils and pole pieces are small. The cryostats for the superconducting coils are easier to design, more compact, and less intrusive, due to a significant reduction in the load carrying requirements of the members needed to support the coils and poles.

Another advantage resides in reduced heat gain of the superconducting magnets through their mechanical supports. Cryogen boil-off can be reduced and/or cryo-coolers can be smaller and less expensive.

Another advantage of the significant reduction in forces is that the position of the pole pieces can be adjusted, even when the field is switched on. Shimming of the magnet is simplified.

Another advantage of the present invention resides in the field homogeneity. There is minimal redirection of the flux distribution at the pole pieces. There is minimal flux density variation across the pole pieces. Comparatively high magnetic field levels are achieved without local flux congestion in the pole pieces redirecting the flux and causing saturation.

Another advantage of the present invention resides in its improved patient access, up to 360°.

Another advantage resides in reduced heat loss from superconducting magnets through mechanical supports.

Another advantage is that the most massive parts of the flux return path are incorporated into the walls. Suspension of the massive parts by the load carrying structures of the building is simplified.

Another advantage of the present invention is that the iron walls shield regions outside of the room from fringe fields.

Another advantage of the present invention resides in the RF shielding provided by the iron walls.

Another advantage of the present invention is that the patient and technician/radiologist are completely inside the iron yoke, instead of being separated from each other by it.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
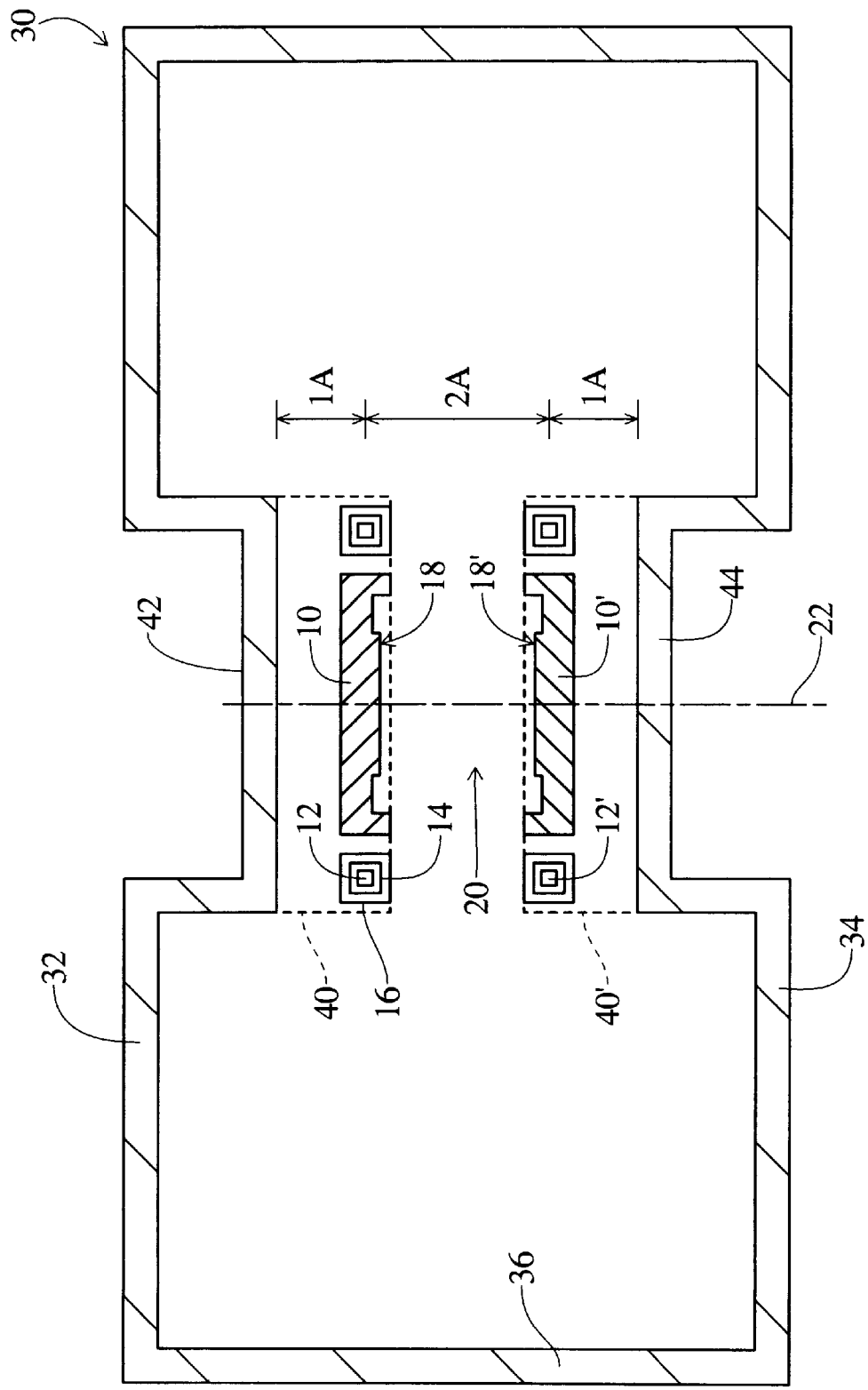
FIG. 1 is an illustration of a cross-section of an RF room and magnet assembly in accordance with the present invention.

With reference to FIG. 1, a first or upper pole piece 10 is surrounded by an annular magnet 12. Preferably, the magnet 12 is a superconducting magnet. To this end, the magnet is disposed in an annular helium can 14 that is surrounded by a vacuum dewar 16. The pole piece 10 is preferably circularly symmetric or oval with a symmetrically contoured face 18 for improving linearity of the magnetic field in a patient gap 20.

A second, lower pole piece 10' is disposed below the upper pole piece 10 symmetrically about a central vertical axis 22 and on the other side of the patient gap 20. The second pole piece is again surrounded by a superconducting magnet 12' and has a contoured pole face 18' for improving magnetic field linearity in the patient gap.

The pole pieces are disposed centrally in an RF room 30 which is defined by or lined with iron, including a ceiling layer 32, a floor layer 34, and a wall layer 36. The ceiling, floor, and wall layers are composed of multiple sections which are mechanically connected together. More specifically, the pole pieces are displaced from each other by a distance 2A and are each displaced from the floor and ceiling iron layers by a distance 1A. Each magnet and pole piece is attracted to the magnetic reflection of itself in the adjoining iron layer. By positioning the pole pieces symmetrically between each other and the iron layer, the attractive force between the magnets is balanced against the attractive force between each magnet and its attraction to its magnetic image mirrored in the floor and ceiling structure. The magnets and pole pieces can be positioned in the room such that the net magnetic forces on the coils and pole pieces can be perfectly balanced. Of course, for patient safety, convenience in bringing the magnets up to field, and supporting gravity weight, the pole pieces and magnets are supported to the ceiling and floor, respectively, be a non-ferrous structure 40, 40'. The support structures within the cryostat 16 of the superconducting magnet assembly are configured for minimal thermal conductivity to minimize heat loss but consistent with requirements of safety, field energizing, weight, and residual forces due to misalignment.

The spacing between the ceiling and floor iron layers away from the magnet assembly is selected to be an appropriate height for the attending physicians and equipment positioned within the room, typically 240 cm or more. The spacing between the ceiling and floor layers adjacent the magnets, as discussed above, is selected to be about twice the vertical dimension of the gap 20. For a typical 65 cm gap, the ceiling and floor layers including projections 42, 44, respectively, which are spaced about 130 cm from each other. Of course, the projections 42, 44 need not be the same. Rather, their relative projection is selected such that a horizontal center of the patient gap 20 is at a convenient height for attending physicians, attendants, and technicians.

For magnets which generate a 0.5 T flux at the isocenter of the patient gap, and which are separated by about 65 cm from each other and about 32.5 cm from the ceiling and floor layers, a total flux through the iron layer is about 1 Wb. To accommodate this flux, the projections 42, 44 have a thickness of about 13 cm. At a radius of 2 m, the ceiling and floor layers can be tapered to about 8 cm. The wall layer, which varies with the dimension of the room, is selected to have sufficient thickness to provide RF shielding, magnetic shielding, and a flux return path which does not saturate, as well as providing support for the ceiling layer. A typical 0.5 T RF room would be expected to receive about 35 tons of iron, which is transported in sections or panels and assembled on site using conventional room construction techniques.

Figure 2:
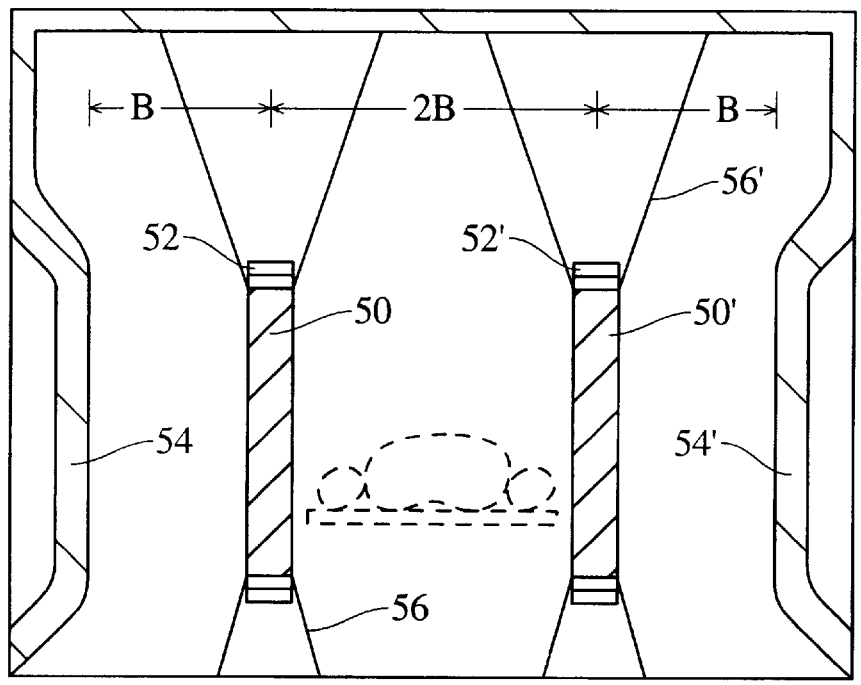
FIG. 2 is an alternate embodiment of the present invention.

With reference to FIG. 2, pole pieces 50, 50' are positioned vertically, surrounded by vertically oriented annular magnets 52, 52'. The pole pieces are preferably elongated in the axial direction of the patient, e.g., oval, in order to provide an enlarged usable field area. The pole pieces are displaced from each other by a distance 2B to define a gap which is sufficiently large to accommodate a typical human patient, preferably on the order of 80–90 cm. The RF room includes iron side wall projections 54, 54' disposed a distance 1B from the respective pole pieces. The projections are magnetically connected with the side walls to provide a flux return path. Preferably, the ceiling and floor also include ferrous flux carrying layers. Non-ferrous structural supports 56 support the magnets and pole pieces on the floor.

Optionally, the magnets are able to be ramped down and de-energized. At least one of the magnets is slidably mounted on the supports to be moved for greater patient access.

Figure 3:
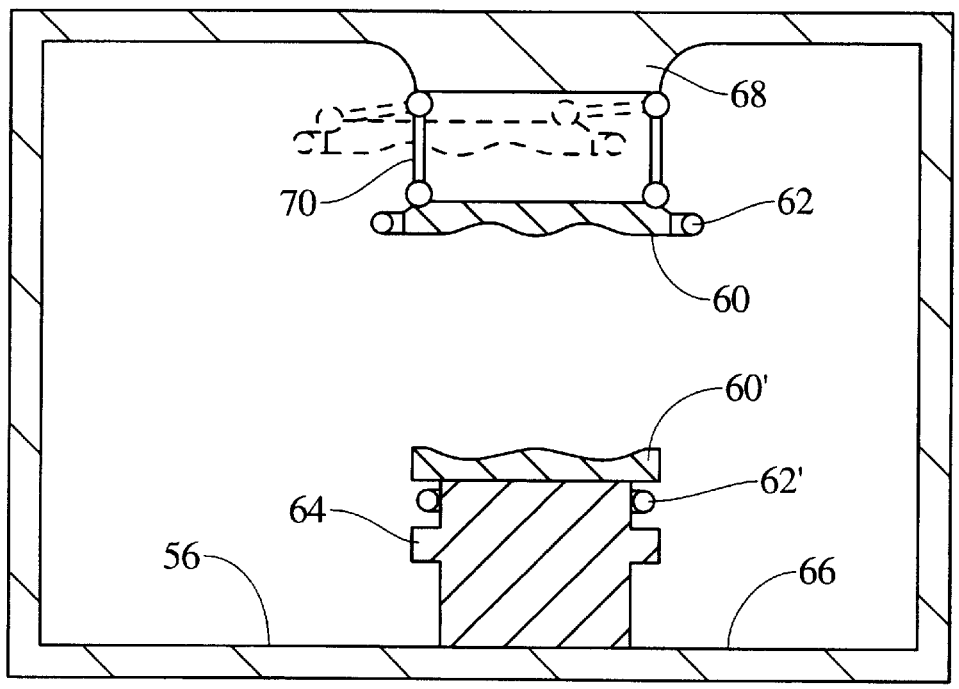
FIG. 3 is another alternate embodiment of the present invention.

With reference to FIG. 3, pole piece 60 is again disposed horizontally and surrounded by horizontally disposed annular superconducting magnet 62. A lower pole piece 60' is supported by a ferrous element 64 which provides both mechanical support and a ferrous flux path to a surrounding iron layer 56. A lower magnet 62', which may be a resistive magnet, is magnetically coupled to the flux path by surrounding the ferrous element 64. The upper magnet is disposed in line with, but displaced from, an upper projection 68 of the shielding iron layer. A pivotable support structure 70 suspends the upper pole piece and magnet above the lower pole piece and magnet. To increase patient access, the upper magnet is extinguished and pivoted on the supports upward and to the side.

In one embodiment, the upper magnet 60 is disposed twice the distance from the lower magnet 60' as from the projection 68 to balance the forces and minimizing the structural requirements on mechanical support 70. In another embodiment, the upper magnet is closer to the lower magnet than twice the distance from the upper projection 68 creating a net pull toward the lower magnet. In this embodiment, the structural support 70 is constructed of elements and materials which are strong in tension. In a third embodiment, the upper pole piece and magnet are further from the lower pole piece and magnet than twice the distance from the iron layer projection 68. In this embodiment, there is a net force pulling the upper magnet and pole piece upward toward the ceiling. In this embodiment, the mechanical support 70 is selected from materials and constructions which are strong in compression. In yet another embodiment, the support structure 70 may include magnetic windings or other structures for focusing the magnetic flux in the air gap between the pole piece 60 and iron layer to minimize magnetic flux leakage into the RF room.

Figure 4:
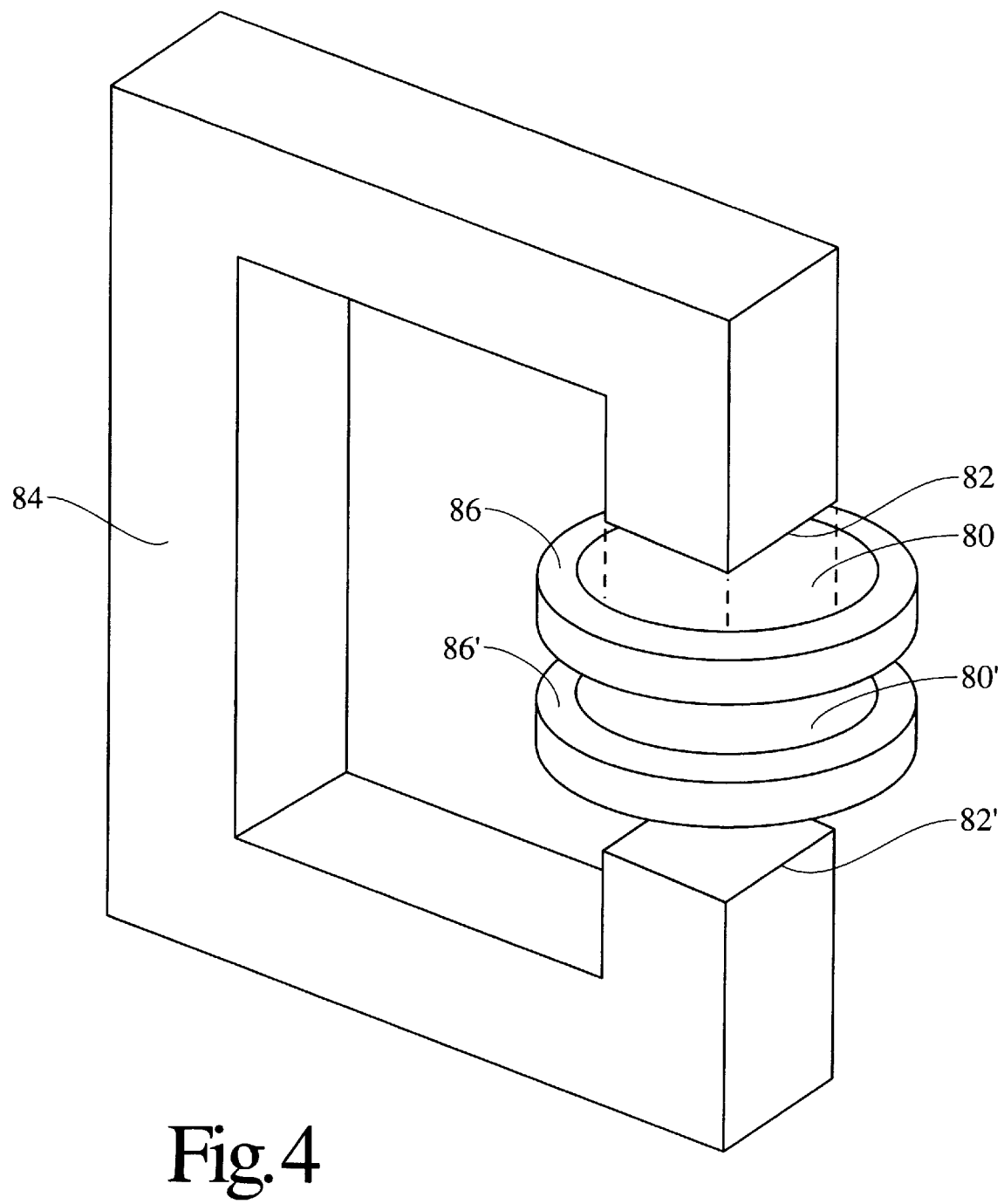
FIG. 4 is another alternate embodiment of the present invention.

With reference to FIG. 4, the present technique is also applicable to magnets with other flux return paths, such as C-magnets. Pole pieces 80, 80' are suspended between ends 82, 82' of a C-shaped ferrous return path 84. As described above, supports (not shown) suspend the pole faces generally twice the distance from each other as each pole face is from an adjacent end of the flux return path. Magnets, such as superconducting magnets 86, 86' surrounding the pole faces, generate a magnetic field between the pole faces. Alternately, a magnetic coil can be wrapped around the flux return path 84.

Figure 5:
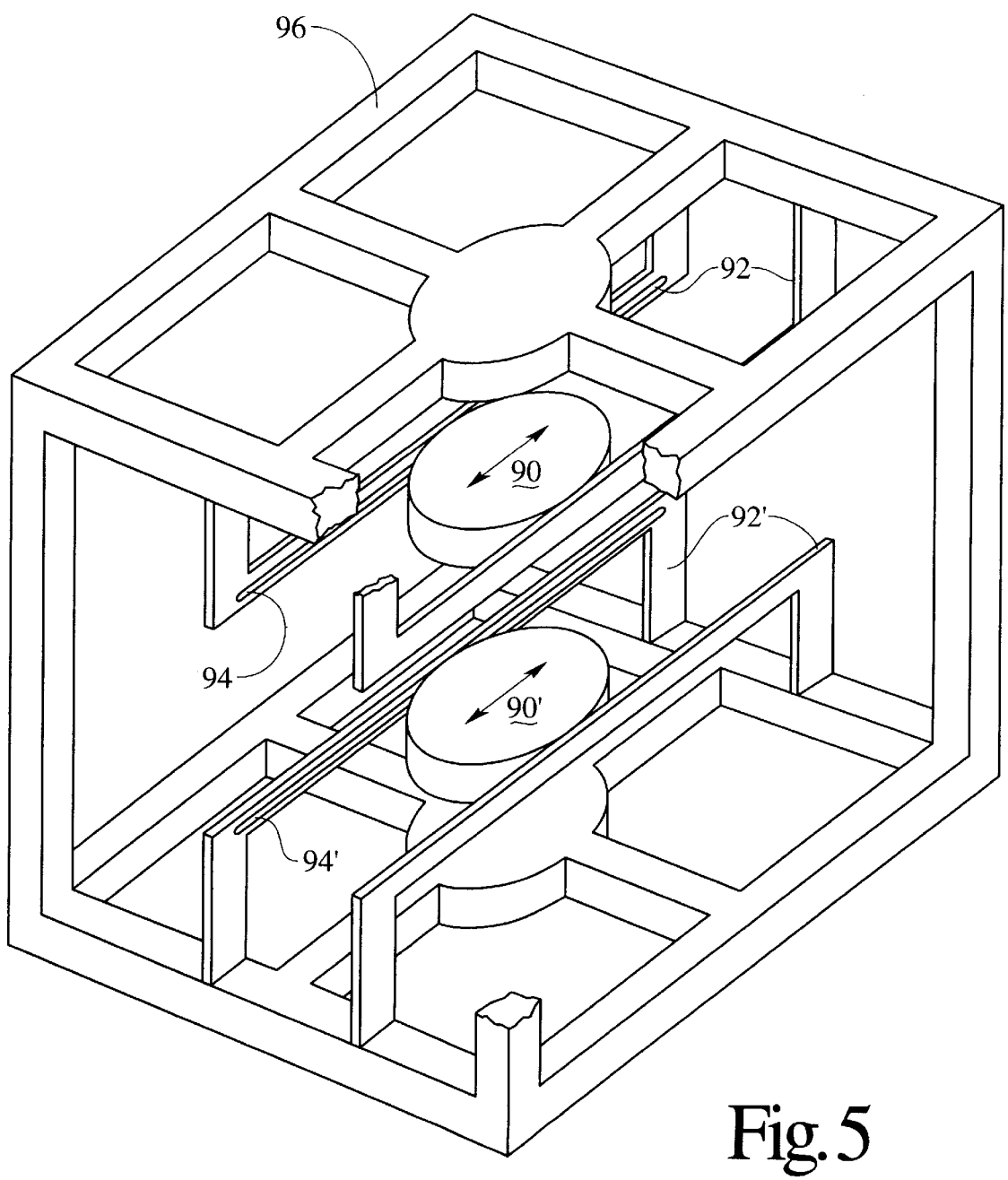
FIG. 5 is yet another alternate embodiment of the present invention.

With reference to FIG. 5, a pair of pole faces 90, 90' are supported on lightweight supports 92, 92'. The pole faces are mounted on tracks 94, 94' for selective sliding movement between a central imaging position (illustrated) and a displaced position for improved patient access. A flux return path 96, a four-posted ferrous assembly in the illustrated embodiment, provides a flux return path. Magnet windings (not shown) are provided in association with either the pole pieces or the flux return path.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnet system comprising:

an upper pole piece;

a lower pole piece disposed parallel and in alignment with the upper pole piece, the upper and lower pole pieces being displaced from each other to define a subject receiving gap therebetween;

a flux return path having a first end adjacent and displaced from the upper pole piece and a second end disposed adjacent the lower pole piece;

a magnet assembly for inducing a magnetic flux through a magnetic flux loop extending between the pole pieces through the subject receiving gap, between the upper pole piece and the flux return path first end, through the flux return path, and between the flux return path second end and the lower pole piece, the magnetic flux causing magnetic attraction forces between the upper and lower pole pieces, between the upper pole piece and the first end of the flux return path, and between the lower pole piece and the second end of the flux return path, the pole pieces being displaced from each other and the first and second ends of the flux return path such that the magnetic attraction forces between the pole pieces is counterbalanced by the magnetic attraction forces between the pole pieces and the first and second ends of the flux return path.

2. A magnet method comprising:

disposing a pair of pole pieces (i) parallel to and displaced from each other to define a patient gap and (ii) displaced from a flux return path;

generating a magnetic flux between the first and second pole pieces across the patient receiving gap, between the pole pieces and the flux return path, and through the flux return path such that the pole pieces are magnetically attracted toward each other and the magnetic pole pieces are magnetically attracted toward the flux return path such that forces on the pole pieces counteract.

3. A magnetic resonance suite comprising:

a ferrous layer extending along a ceiling;

a ferrous layer extending along a floor region;

an electrical coil for generating a magnetic flux through a patient receiving region and the floor and ceiling ferrous layers;

a pole piece disposed adjacent and commonly supported with the electrical coil, the pole piece and the electric coil being disposed on one side of the patient receiving region such that the magnetic flux generated by the electric coil is focused through the patient receiving region by the pole piece, the pole piece and the electrical coil being mounted horizontally, the pole piece and the electric coil being disposed adjacent and displaced from the ceiling ferrous layer by a region free of ferrous material, the pole piece and the electric coil being urged by gravity and magnetic attraction downward toward the floor ferrous layer, which downward urging is counterbalanced by magnetic attraction across the ferrous material-free region between the pole piece and the ceiling ferrous layer.

4. A magnetic resonance suite comprising:

electrical coils for generating a magnetic flux through a receiving region and a flux return path;

the flux return path including:

a ferrous layer extending along a ceiling, a ferrous layer extending along a floor region, ferrous side sections extending between the floor and ceiling ferrous layers, the ferrous side sections being disposed sufficiently displaced from the receiving region that complete, unobstructed access is provided 360° around the receiving region;

a pole piece disposed adjacent the receiving region and adjacent but displaced from the ceiling layer by a ferrous-free zone, a lower ferrous structure disposed adjacent the receiving region and the floor ferrous layer, the pole piece and the lower ferrous structure being disposed on opposite sides of the receiving region such that the pole piece focuses the magnetic flux through the receiving region, the pole piece being separated from the lower ferrous structure by a first displacement dimension and displaced from the ceiling layer by half the first displacement dimension.

5. A magnetic resonance imaging suite comprising:

electrical coils for selectively generating a magnetic flux through a patient receiving region;

an upper ferrous structure disposed adjacent a ceiling region above the patient receiving region;

a lower ferrous structure disposed adjacent a floor region below the patient receiving region;

magnetic flux carrying structures being displaced peripherally from the patient receiving region sufficiently to provide unobstructed access by physicians and technicians around the patient receiving region;

a pole piece disposed adjacent to and displaced from the upper ferrous structure, during imaging the pole piece being disposed in an imaging position above the patient receiving region such that the magnetic flux is focused through the patient receiving region, when magnetic flux is not flowing through the pole piece, the pole piece being selectively movable from the imaging position adjacent the patient receiving region to a second, displaced position remote from the patient receiving region to provide greater access to the patient receiving region from above.

6. A magnet system including a magnetizing coil disposed in a shielded room displaced from a patient receiving region for generating magnetic flux that flows through the receiving region, the system further comprising:

an upper ferrous structure disposed above the receiving region adjacent a ceiling of the shielded room;

a lower ferromagnetic structure disposed below the receiving region;

the magnetizing coil being disposed adjacent and displaced from the upper ferrous structure and the lower ferromagnetic structure such that the magnetizing coil is magnetically attracted toward the upper ferrous structure, the displacement of the magnetizing coil from the upper ferrous structure being such that the magnetic attraction between the magnetizing coil and the upper ferrous structure counteracts downward forces on the magnetizing coil;

an access region surrounding the receiving region, the access region being free of ferrous structure such that the receiving region is freely accessible therearound.

7. A magnet system comprising:

an upper pole assembly for focusing magnetic flux through a gap;

a lower pole structure disposed parallel and in alignment with the upper pole assembly, the upper pole assembly and the lower pole structure being displaced from each other to define the gap therebetween;

a flux return path including an upper end ferrous structure adjacent and displaced from the upper pole assembly;

a magnet assembly for inducing a magnetic flux through a magnetic flux loop extending through the gap, through the upper pole assembly, between the upper pole assembly and the flux return path upper end, through the flux return path, and through the lower pole structure, the magnetic flux causing magnetic attraction forces between the upper pole assembly and the lower pole structure, and between the upper pole assembly and the upper end ferrous structure of the flux return path, the upper pole assembly being displaced from the lower pole structure and from the flux return path upper end ferrous structure by a ferrous-free region such that the magnetic attraction forces between the upper pole assembly and the lower pole structure is counterbalanced by the magnetic attraction forces between the upper pole assembly and the flux return path upper end ferrous structure.

8. The magnet system as set forth in claim 7 further including a support structure for supporting the upper pole piece, the support structure movably supporting the upper pole piece such that the pole piece is selectively movable away from the gap.

9. A magnetic method comprising:

mounting ferrous sheathing adjacent at least a ceiling surface of a shielded room;

disposing an upper pole piece with associated electromagnetic coils in the shielded room displaced above a receiving region and below a portion of the ferrous sheathing, the upper pole piece and the receiving region being surrounded peripherally by a region that is free of the ferrous sheathing and other ferrous structures for a sufficient distance to provide free access to the receiving region;

conducting an electrical current through the electromagnetic coils such that a magnetic flux flows (i) through the receiving region, (ii) through the upper pole piece and through the ferrous sheathing, and (iii) through a ferrous-free region between the upper pole piece and the portion of the ferrous sheathing such that the upper pole piece is attracted with an upward force toward the above portion of the ferrous sheathing.

10. A magnetic method comprising:

disposing an upper pole piece and a lower ferrous structure (i) parallel to and displaced from each other to define a first gap and (ii) with the upper pole piece displaced from a flux return path to define a ferrous-free second gap;

generating a magnetic flux between the upper pole piece and the lower ferrous structure across the first gap, across the second gap between the upper pole piece and the flux return path, and through the flux return path such that the upper pole piece is magnetically attracted toward the lower ferrous structure and the upper pole piece is magnetically attracted toward the flux return path such that counteracting magnetic attraction forces are executed on the upper pole piece.

11. The method as set forth in claim 10 further including:

ramping down the magnetic flux; and moving the pole piece away from the first gap.

12. A magnet for an MRI system comprising:

a first terminal ferrous portion above a patient receiving region and a second terminal ferrous portion below the patient receiving region;

a coil for inducing a magnetic flux between the first and second terminal ferrous portions through the patient receiving region;

at least one pole element disposed between and displaced from the first and second terminal ferrous portions such that the magnetic flux flows through and magnetizes the pole element, the magnetized pole piece being magnetically attracted (i) downward toward ferrous structures below the patient receiving region and (ii) upward toward the first terminal ferrous portion, the pole element being positioned such that the upward and downward forces are opposite and substantially offsetting in magnitude.

13. A magnet system comprising:

a first pole piece disposed adjacent an examination region;

an upper ferrous structure rigidly mounted above the first pole piece;

a lower rerrous structure rigidly mounted below the first pole piece;

a magnet assembly for inducing magnetic flux between the upper and lower ferrous structures through the pole piece and the examination region.

14. The magnet system as set forth in claim 13 wherein the periphery of the upper and lower ferrous structures are free of supporting structures contiguous to the examination region such that 360° of peripheral access by surgeons and attendants is provided.

15. The magnet system as set forth in claim 13 wherein the flux flowing through the first pole piece induces a first magnetomotive force between the first pole piece and the upper ferrous structure, a second magnetomotive force between the first pole piece and the lower ferrous structure, the first pole piece being disposed such that the first magnetomotive force is substantially balanced by the second magnetomotive force and gravitational forces on the pole piece.

16. The magnet system as set forth in claim 15 wherein at least one of the upper ferrous structure, the pole piece, and the lower ferrous structure includes a superconducting magnet for inducing the magnetic flux.

17. The magnet system as set forth in claim 16 wherein the lower ferrous structure includes at least one of a second pole piece and an electromagnet.

18. A magnet method comprising:

disposing a pole piece between upper and lower ferrous structures and above an examination region disposed between the upper and lower ferrous structures;

generating a magnetic flux between the first and second ferrous structures through the pole piece and the examination region.

19. The method as set forth in claim 18 wherein the step of disposing the pole piece includes positioning the first pole piece such that magnetomotive forces induced in the pole piece by the magnetic flux which cause a magnetic attraction toward the pole piece are substantially balanced by magnetomotive forces between the pole piece and the lower ferrous structure and gravity.

20. The method as set forth in claim 19 further including:

positioning a patient in the examination region;

conducting a magnetic resonance imaging procedure.

21. The method as set forth in claim 20 further including moving the patient transversely and longitudinally through the examination region to facilitate surgeon and attendant access from 360° around the patient.

* * * * *